United States Patent
Kouvetakis et al.

(10) Patent No.: US 6,911,084 B2
(45) Date of Patent: Jun. 28, 2005

(54) LOW TEMPERATURE EPITAXIAL GROWTH OF QUATERNARY WIDE BANDGAP SEMICONDUCTORS

(75) Inventors: John Kouvetakis, Mesa, AZ (US); Ignatius S. T. Tsong, Tempe, AZ (US); Radek Roucka, Tempe, AZ (US); John Tolle, Gilbert, AZ (US)

(73) Assignee: Arizona Board of Regents, Tempe, AZ (US)

(*) Notice: Subject to any disclaimer, the term of this patent is extended or adjusted under 35 U.S.C. 154(b) by 89 days.

(21) Appl. No.: 09/981,024

(22) Filed: Oct. 16, 2001

(65) Prior Publication Data

US 2003/0056719 A1 Mar. 27, 2003

Related U.S. Application Data

(63) Continuation-in-part of application No. 09/965,022, filed on Sep. 26, 2001, now abandoned.

(51) Int. Cl.$^7$ .............................................. C30B 25/08
(52) U.S. Cl. ...................................................... 117/103
(58) Field of Search ............................ 117/84, 92, 103, 117/108

(56) References Cited

U.S. PATENT DOCUMENTS

| 5,766,783 | A | * | 6/1998 | Utsumi et al. | 428/698 |
| 5,952,111 | A | * | 9/1999 | Sugg et al. | 428/623 |
| 6,503,561 | B1 | * | 1/2003 | Senzaki et al. | 427/226 |

OTHER PUBLICATIONS

Teter, D.M., MRS Bulletin, "Computational Alchemy: The Search for New Superhard Materials", vol. 23, No. 1, pp. 22–27 (1998).

Morkoc, et al., Journal of Applied Physics, "Large–band–gap SiC, III–V Nitride, and II–VI ZnSe–based Semiconductor Device Technologies", vol. 76, pp. 1363–1398 (1994).

Tanaka et al., Applied Physics Letters, "Initial Stage of Aluminum Nitride Film Growth on 6H–silicon Carbide by Plasma–assisted, Gas–Source Molecular Beam Epitaxy", vol. 66, No. 1, pp. 37–39 (1995).

(Continued)

Primary Examiner—Nadine G. Norton
Assistant Examiner—Matthew Anderson
(74) Attorney, Agent, or Firm—Richard E. Oney; Tiffany & Bosco, P.A.; Kitje Murray

(57) ABSTRACT

A method of growing quaternary epitaxial films having the formula YCZN wherein Y is a Group IV element and Z is a Group III element at temperatures in the range 550–750° C. is provided. In the method, a gaseous flux of precursor $H_3YCN$ and a vapor flux of Z atoms are introduced into a gas-source molecular beam epitaxial (GSMBE) chamber where they combine to form thin film of YCZN on the substrate. Preferred substrates are silicon, silicon carbide and AlN/silicon structures. Epitaxial thin film SiCAlN and GeCAlN are provided. Bandgap engineering may be achieved by the method by adjusting reaction parameters of the GSMBE process and the relative concentrations of the constituents of the quaternary alloy films. Semiconductor devices produced by the present method have bandgaps from about 2 eV to about 6 eV and exhibit a spectral range from visible to ultraviolet which makes them useful for a variety of optoelectronic and microelectronic applications. Large-area substrates for growth of conventional Group III nitrides and compounds are produced by SiCAlN deposited on large-diameter silicon wafers. The quaternary compounds, especially the boron containing compounds, exhibit extreme hardness. These quaternary compounds are radiation resistant and may be used in space exploration.

19 Claims, 8 Drawing Sheets

OTHER PUBLICATIONS

Ruh, et al., Journal of The American Ceramic Society, "Composition and Properties of Hot–Pressed SiC–AlN Solid Solutions", vol. 65, pp. 260–265 (1982).

Rafaniello, et al., Journal of the American Ceramic Society, "Investigation of Phase Stability in the System SiC–AlN", vol 66, No. 4, pp. 272–276 (1983).

Zangvil, et al., Journal of the American Ceramic Society, "Phase Relationships in the Silicon Carbide–Aluminum Nitride System", vol. 71, No. 10, pp. 884–890 (1988).

Parker E.H.C(Ed.), "The Technology and Physics of Molecular Beam Epitaxy", Chapter 2, pp. 15–46 and Chapter 11, pp. 345–386, Plenum Press (1985).

Kern, et al., Journal of Materials Research, Solid Solutions of AlN and SiC Grown by Plasma–assisted, Gas–source Molecular Beam Epitaxy, vol. 8, No. 7, pp. 1477–1480 (1993).

Kern, et al., Journal of Materials Research, Aluminum Nitride–silicon Carbide Solid Solutions Grown by Plasma–assisted, Gas–source Molecular Beam Epitaxy, vol. 13, No. 7, pp. 1816–1822 (1998).

Jenkins, et al., Journal of Crystal Growth, "Growth of Solid Solutions of Aluminum Nitride and Silicon Carbide by Metalorganic Chemical Vapor Deposition", vol. 128, Nos. 1–4, pp. 375–378 (1993).

Safaraliev, et al., Soviet Physics Semiconductors, "Wide–gap $(SiC)_{1-x}(AlN)_x$ Solid Solutions", vol. 25, No. 8, pp. 865–871 (1991).

MacDiarmid, Journal of Inorganic and Nuclear Chemistry, "Pseudo–halogen Derivatives of Monosilane", vol. 2, No. 2, pp. 88–94 (1956).

Goldfarb, The Journal of Chemical Physics, "Infrared Spectrum and Structure of Germyl Cyanide", vol. 37, No. 3, pp. 642–646 (1962).

Pandey, et al. Journal of Applied Physics, "A Theoretical Study of Stability, Electronic and Optical Properties of GeC and SnC", vol. 88, No. 11, p. 6462–6466 (2000).

* cited by examiner

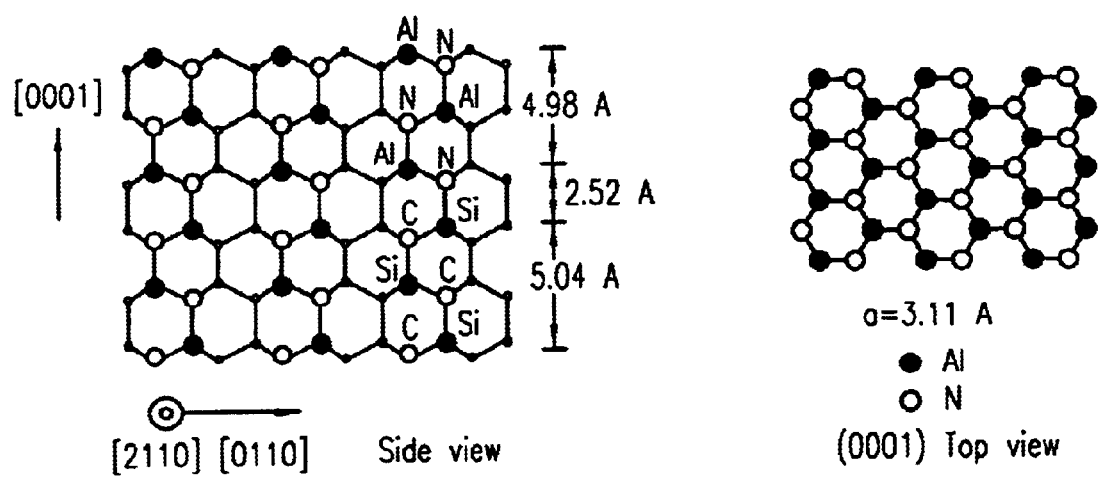
FIG 5A
FIG 5B
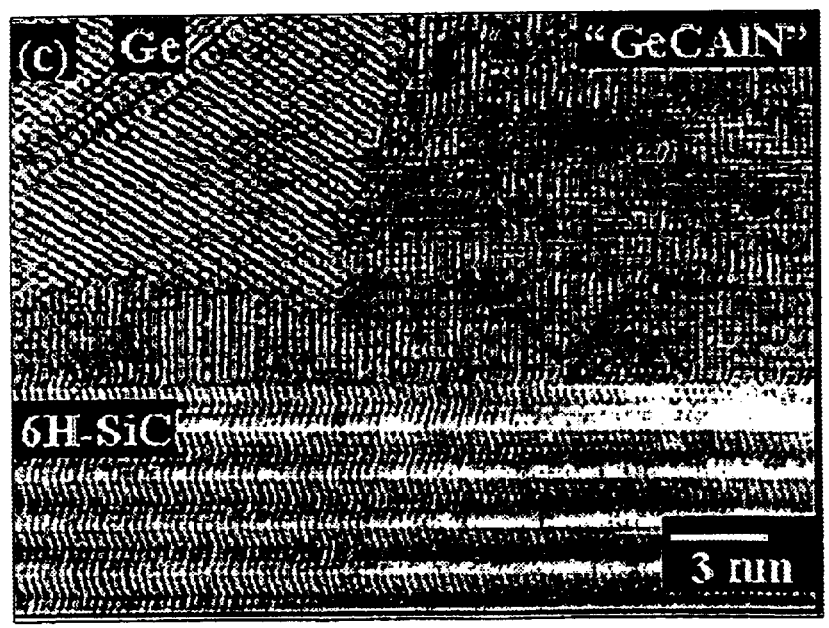
FIG 6

Rms: 6.48 nm    Ra: 2.65 nm

LOW TEMPERATURE EPITAXIAL GROWTH OF QUATERNARY WIDE BANDGAP SEMICONDUCTORS

RELATED INVENTION

The present invention is a Continuation-In-Part (CIP) of "Low Temperature Epitaxial Growth of Quaternary Wide Bandgap Semiconductors," U.S. patent application Ser. No. 09/965,022, filed Sep. 26, 2001, now abandoned, which is incorporated by reference herein.

STATEMENT OF GOVERNMENT FUNDING

The U.S. Government through the US Army Research Office provided financial assistance for this project under Grant No. DAAD19-00-1-0471 and through the National Science Foundation under Grant No. DMR-9986271. Therefore, the United States Government may own certain rights to this invention.

INTRODUCTION

1. Field of Invention

This invention concerns a method for forming epitaxial thin films by means of gas source molecular beam epitaxy (GSMBE). More particularly, this invention relates to a method for growing high purity, low defect, device quality SiCAlN epitaxial films on silicon and silicon carbide substrates. SiCAlN films deposited on large diameter silicon wafers also serve as large-area substrates for Group III nitride growth. Semiconductor films are provided with bandgaps ranging from 2 eV to 6 eV with a spectral range from visible to ultraviolet, useful for a variety of optoelectronic and microelectronic applications.

2. Background

Quaternary semiconductors have been sought which incorporate the promising physical and electronic properties of their individual components. Wurtzite AlN and α-SiC have many similar physical properties such as mechanical hardness (1) and thermal expansion (2,3) as well as closely matched lattice parameters (a=3.11 Å, c=4.98 Å for AlN; a=3.08 Å, c=5.04 Å for 2H—SiC). Both AlN and SiC are well known wide bandgap semiconductors, with wurtzite AlN having a 6.3 eV direct bandgap and 2H—SiC a 3.3 eV indirect bandgap. Quaternary materials are expected to have bandgaps intermediate to those of the constituent binary systems and in some cases the bandgaps may become direct. Thus quaternary compounds offer promise for application in a wide variety of optoelectronic devices.

Early attempts to fabricate ceramic alloys in the quaternary SiC-AlN system by hot-pressing generally involve very high temperatures in the range of 1700–2100° C. (4,5). Studies of hot-pressed SiCAlN samples led Zangvil and Ruh (6) to propose a phase diagram showing a flat miscibility gap at 1900° C. above which a 2H solid solution of SiCAlN could form. Below 1900° C., the ceramic was found to consist of separate SiC and AlN phases, indicating negligible solubilities between AlN and SiC. The miscibility gap spans from 15 to 85 mol % AlN, thus posing likely difficulties for the growth of SiCAlN alloy thin films by conventional techniques at lower temperatures.

Hunter in U.S. Pat. No. 6,063,185 discloses methods for producing bulk crystals of SiCAlN which are useful as substrates when sliced into thin wafers for thin film deposition.

The epitaxial growth of thin films is one of the major successes in epitaxial techniques such as molecular beam epitaxy (MBE) (7). The growth of metastable structures not available in nature allows the achievement of properties previously unattainable in equilibrium systems.

Solid solutions of AlN and SiC have been grown on vicinal 6H—SiC substrates by MBE at temperatures between 900° C. and 1300° C. by Kern et al.(8,9) using disilane ($Si_2H_6$), ethylene ($C_2H_4$), nitrogen plasma from an electron cyclotron resonance (ECR) source, and Al evaporated from an effusion cell. The $(SiC)_{1-x}(AlN)_x$ films were shown to be monocrystalline with a wurtzite (2H) structure for x≧0.25 and a cubic (3C) structure with x≦0.25. Jenkins et al.(10) reported the growth of $(SiC)_{1-x}(AlN)_x$ solid solutions with x varying from x=0.1 to x=0.9 using metalorganic chemical vapor deposition (MOCVD) with silane ($SiH_4$), propane ($C_3H_8$), ammonia ($NH_3$) and trimethylaluminum (TMA) in a hydrogen carrier gas. The films were grown on Si(100) substrates at temperatures 1200–1250° C. and pressures between 10 and 76 Torr. Safaraliev et al. (11) deposited films of $(SiC)_{1-x}(AlN)_x$ on 6H—SiC substrates via the sublimation of sintered SiC—AlN plates at temperatures 1900–2100° C. They determined a range of hardness between 20 and 30 GPa for the alloy films. Because of the hardness of the components, it is anticipated that GeCAlN films or coatings and other carbide/nitride quaternary semiconductors comprising Group IV and Group III elements would possess similar superhard properties.

These high temperature synthetic methods, although of research importance, are not suitable for commercial production of SiCAlN or other quaternary thin films comprising Group IV and Group III elements. Methods for growing epitaxial quaternary thin films, especially SiCAlN, under low temperature conditions that are commercially acceptable have been sought. Likewise, other promising epitaxial quaternary semiconductors and methods for depositing them as thin films on substrates useful as semiconductor devices in a wide variety of optoelectronic and microelectronic applications have been sought.

REFERENCES

1. Teter, D. M, MRS Bulletin 23(1), 22 (1998).
2. Moroc, H, Strite, S, Gao, G B Lin, M E, Sverdlov B. Burns, M J, Appl. Phys. 76, 1363 (1994).
3. Tanaka, S, Kern R S, Davis R, Appl. Phys. Lett. 66, 37 (1995).
4. Ruh R., Zangvil A, J. Am. Ceram. Soc. 65, 260 (1982).
5. Rafaniello W, Plichta M R, Virkar A V, J. Am. Ceram. Soc 66, 272 (1983).
6. Zangvil A, Ruh R, J. Am. Ceram. Soc 71, 884 (1988).
7. Parker E. H. C(Ed.), "The Technology and Physics of Molecular Beam Epitaxy", Plenum Press (1985).
8. Kern R S, Rowland L B, Tanaka S, Davis R F, J. Mater. Res. 8, 1477 (1993).
9. Kern R S, Rowland L B, Tanaka S,. Davis R. F, J. Mater. Res. 13, 1816 (1998).
10. Jenkins I, Irvine K G, Spencer M G, Dmitriev V, Chen N, J. Cryst. Growth 128, 375 (1993).
11. Safaraliev G K,, Tairov Yu M, Tsvetkov V F, Sov. Phys. Semicond. 25, 865 (1991).
12. McDiarmid A G Inorganic and Nuclear Chemistry, 1956, 2, 88–94.
13. Goldfarb T D, The Journal of Chemical Physics 1962, 37, 642–646.).
14. Pandey R,. Rerat M, Darrigan C, Causa M, J. Appl. Phys. 88, 6462 (2000).

SUMMARY

Accordingly, it is an object of the present invention to provide a low temperature MBE method for the production of epitaxial quaternary semiconducting thin films. Methods for growing low-defect, thin film semiconductors of the general formula $(YC)_{(0.5-x)}(ZN)_{(0.5+x)}$ wherein Y is a Group IV element and Z is a Group III element and 0<x<0.5 on a silicon or silicon carbide substrate are provided.

It is a further object of the invention to provide epitaxial quaternary SiCAlN and GeCAlN and other semiconductors produced by the present method. Semiconductor films comprising the quaternary compounds are provided. Such films exhibit bandgaps from about 2 eV to about 6 eV and exhibit a spectral range from visible to ultraviolet which makes them useful for a variety of optoelectronic applications. The quaternary compounds may also be used as a superhard coating material.

These and other objects of the invention are achieved by directing onto a substrate surface a gaseous precursor compound having the general formula $H_3YCN$, wherein Y is a Group IV element and H is hydrogen or deuterium, while at the same time as a flux of Group III metal atoms are also deposited onto the same substrate in an MBE chamber. The growth of quaternary semiconducting thin films is accomplished on substrates of silicon, including large diameter silicon wafers, silicon carbide, and aluminum nitride/silicon wafers.

BRIEF DESCRIPTION OF THE FIGURES

FIG. 4 is a XTEM image of a SiCAlN film grown on Si(111).

FIG. 5 illustrates a proposed model of the SiCAlN wurtzite structure. 5(a) is a side view of SiCAlN atomic structure and 5(b) is a top view of the same structure.

FIG. 6 is an XTEM image of GeCAlN film grown on 6H—SiC(0001) substrate showing epitaxial interface and Ge precipitate.

FIG. 7 is an XTEM image of GeCAlN film grown on Si(111) substrate.

FIG. 12 illustrates atomic force microscopy (AFM) images showing the surface morphology of a SiCAlN film grown on SiC(0001).

DETAILED DESCRIPTION

Figure 1:
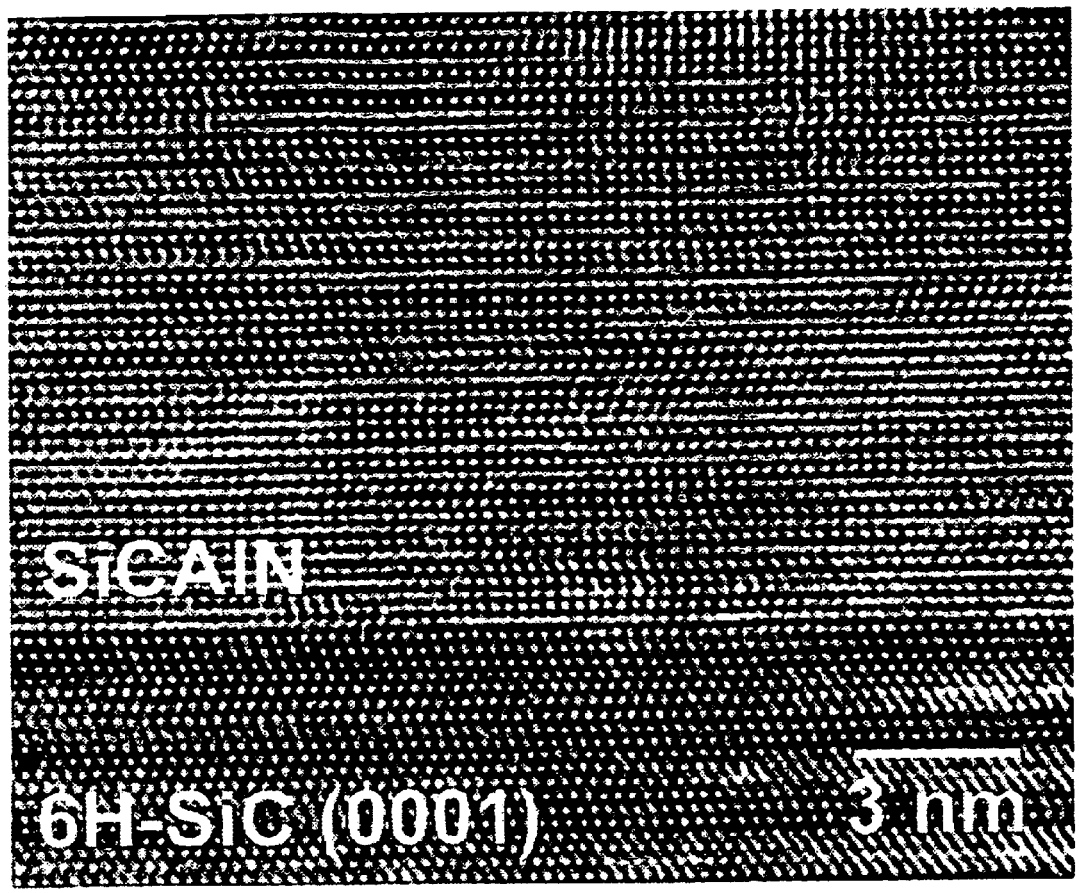
FIG. 1 is a high-resolution the cross-sectional transmission electron microscopy (XTEM) image of an epitaxial SiCAlN film grown on α-Si(0001) by the method of the present invention.

While the present invention will be described more fully hereinafter with reference to the examples and accompanying drawings, in which aspects of the preferred manner of practicing the present invention are shown, it is to be understood at the outset of the description which follows that persons of skill in the appropriate arts may modify the invention herein described while still achieving the favorable results of this invention. Accordingly, the description which follows is to be understood as being a broad, teaching disclosure directed to persons of skill in the appropriate arts, and not as limiting upon the present invention.

This invention provides a low temperature method for growing epitaxial quaternary thin films having the general formulae YCZN wherein Y is a Group IV element and Z is a Group III element in a gas source molecular beam epitaxial chamber utilizing gaseous precursors having a structure comprising Y—C—N bonds.

An "epitaxial" film generally refers to a film with the highest order of perfection in crystallinity, i.e. as in a single crystal. Because of their low defect density, epitaxial films are especially suitable for microelectronic and, more particularly, optoelectronic applications. The epitaxial growth of unimolecular films is generally achieved in a molecular beam epitaxy (MBE) apparatus. In molecular beam epitaxy (MBE), molecular beams are directed at a heated substrate where reaction and epitaxial film growth occurs. The technology is fully described in E. H. C. Parker (Ed.) "The Technology and Physics of Molecular Beam Epitaxy", Plenum Press (1985) (7). By selecting the appropriate flux species in MBE, and by exercising precise control of the kinetic factors, i.e., flux rate, flux ratio, and substrate temperature, during growth, the morphology, composition and microstructure of films can be tailored on an atomic level.

In our present method, deposition of epitaxial film conforms to a variation of gas-source molecular beam epitaxy (GSMBE) which comprises a flux of a gaseous precursor and a vapor flux of metal atoms directed onto a substrate where the precursor reacts with the metal atoms to commence growth of epitaxial thin film on the substrate. Typically, the gaseous precursor is connected via a high vacuum valve to the MBE chamber (which will be known henceforth as a GSMBE reaction chamber) containing a heated substrate. Also installed in the GSMBE reaction chamber is a gas effusion Knudsen cell containing metal atoms. Sources of other vapor flux atoms may also be installed in the chamber. The gaseous precursor is allowed to flow into the reaction chamber which is typically maintained at a base pressure of about $10^{-10}$ Torr by a ultrahigh vacuum pumping system In the present method, the film growth process is conducted in the GSMBE chamber with the substrate held at temperatures between ambient temperature and 1000° C., preferably in the range of 550° C. to 750° C., with flux species consisting of a unimolecular gas-source precursor and elemental atoms from one or more effusion cells. The precursor provides the "backbone" or chemical structure upon which the quaternary compound builds. The substrates are preferably silicon or silicon carbide wafers. In the method, the substrate, growth temperature, flux species and flux rate may be chosen to determine various features of the quaternary film undergoing growth.

The present method is based on thermally activated reactions between the unimolecular precursor and metal atoms, Z. The molecular structure of the precursor consists of a linear Y—C—N skeleton with the target stoichiometry and direct Y—C bonds that favor low-temperature synthesis of the quaternary thin film. Any remaining H—Y terminal bonds are relatively weak and are eliminated as gaseous $H_2$ byproducts at low temperatures, making a contamination-free product. The unsaturated and highly electron-rich N site of the C—N moiety has the required reactivity to spontaneously combine with the electron-deficient metal atoms (Z) to form the necessary Z—N bonding arrangements without any additional activation steps.

In the present method, gaseous flux of unimolecular precursor having the formula $H_3YCN$ in vapor form wherein Y is a Group IV element, preferably silicon or germanium and H is hydrogen or deuterium is introduced into a GSMBE chamber. A vapor flux of Z atoms, wherein Z is a Group III metal, is also introduced into the chamber from an effusion cell. Pressure and other conditions in the chamber are maintained to allow the precursor and the Z atoms to combine and form epitaxial YCZN on the substrate. Temperature of the substrate during the reaction maintained at a value above ambient and less than 1000° C., considerably below the temperature of the miscibility gap of SiC and AlN phases at 1900° C. (6). Most preferably the temperature is maintained between about 550° C. to 750° C.

In an important aspect of the method of the present invention, a precursor compound having the formula $H_3YCN$ wherein Y is a Group IV element, preferably silicon (Si) or germanium (Ge) and wherein H is hydrogen or deuterium, is provided. The precursor $H_3SiCN$ may be synthesized in a single-step process by a direct combination reaction of $SiH_3Br$ and AgCN. Other suitable methods for preparation of $H_3SiCN$ are known in the art. See, e.g. the method reported by A. G McDiarmid in "Pseudohalogen derivatives of monosilane" Inorganic and Nuclear Chemistry, 1956, 2, 88–94) (12) which involves the reactions of $SiH_3I$ and AgCN. $H_3SiCN$ is a stable and highly volatile solid with a vapor pressure of 300 Torr at 22° C., well suited for the MBE film-growth process. For preparation of quaternary YCZN wherein Y is germanium, the precursor $D_3GeCN$ is provided. In these instances, deuterium replaces hydrogen in the precursor to achieve better kinetic stability. The unimolecular precursor $GeD_3CN$ may be synthesized using a direct reaction of $GeD_3Cl$ with AgCN. Other methods for preparation of $GeD_3CN$ utilize $GeD_3I$ as the source of $GeD_3$ as disclosed in "Infrared spectra and structure of germyl cyanide" T. D. Goldfarb, The Journal of Chemical Physics 1962, 37, 642–646. (13).

In certain instances of the method, the flux rate of metal atom (Z) and precursor are maintained at a rate that provides an essentially equimolar amount of precursor and metal atom to the surface of the substrate i.e., the number of precursor molecules arriving at the substrate surface is the same as the number of metal atoms from the Knudsen effusion cell. In these instances, the quaternary semiconductor that is formed is essentially stoichiometric YCZN and will have the formula $(YC)_{(0.5-x)}(ZN)_{(0.5+x)}$ wherein Y is a Group IV element and Z is a Group III element and x is essentially zero.

In certain other instances of the method, the stoichiometry of the quaternary compound may be changed by increasing the amount of ZN component. In these instances, extra N-atoms which may be generated by methods known in the art, preferably from a radio frequency (RF) plasma source (also mounted in the MBE chamber) are supplied and the metal (Z) atom flux is increased slightly. The ZN content of the quaternary compound is thus increased to more than 50%, i.e., x>0, as metal atoms Z combine with N in the Y—C—N precursor and also with the gaseous N-atoms to form additional ZN. Correspondingly, the YC content will become less than 50%, i.e. drop to 0.5−x, because YC+ZN= 100%. In these instances, the resultant semiconductor will have the formula $(YC)_{(0.5-x)}(ZN)_{(0.5+x)}$ wherein Y is a Group IV element and Z is a Group III element and x is between 0 and 0.5.

In an important aspect of the invention, the bandgap of the semiconductors may be adjusted by varying the deposition parameters to create a series of $(YC)_{0.5-x}(ZN)_{(0.5+x)}$ films with different values of x. The bandgap of the quaternary film will reflect the relative concentrations, or stoichiometry of the two components. The composition of the film, i.e. the value of x, can be adjusted by supplying excess C as from $CH_4$ gas or N as N-atoms from a radio-frequency plasma source. In certain instances, for example when the YC component of the quaternary compound has a different band gap from the ZN component, the flux ratio of precursor, metal atoms and nitrogen atoms may be controlled to increase the amount of ZN in the film and to provide a quaternary film having the desired bandgap.

The bandgap can also be adjusted by changing the constituents, for example, from SiC to GeC or SnC (with calculated bandgaps of 1.6 eV and 0.75 eV respectively). In these instances, the formula of the quaternary compounds will be $(YC)_{(0.5-x)}(ZN)_{(0.5+x)}$ wherein Y and Z are independently the same or different in each occurrence. Thus a complete series of solid solutions between Group IV carbides and Group III nitrides can be synthesized via the present method to provide semiconductors with bandgaps ranging from 2 eV to 6 eV, covering a spectral range from infrared to ultraviolet, ideal for a variety of optoelectronic applications. Examples of related novel systems may be selected from the group comprising SiCGaN, SiCInN, GeCGaN, SnCInN, GeCInN.

In preferred methods of the present invention, the YCZN quaternary films are grown on semiconductor substrates, preferably Si(111) or α-SiC(0001). Si(100) and Si wafers of other orientations or other material structures may also be used as substrates. Deposition on α-SiC(0001) substrates is virtually homoepitaxy which leads to a low density of misfit and threading dislocations desirable in semiconductors. In those instances wherein silicon is the substrate, a native $SiO_2$ layer is generally present, and the quaternary film is deposited on the $SiO_2$ layer. It has been observed that in the present method, the amorphous oxide layer is largely replaced with a crystalline aluminum oxide layer which in turn promotes epitaxial growth of the quaternary film. FIG. 4 illustrates this phenomenon.

In certain instances, the epitaxial film is deposited on a buffer layer on the silicon substrate. In these instances, the buffer layer provides improved lattice matching for epitaxial growth of the film. Deposition on AlN/Si(111) substrates, for example, is virtually homoepitaxy which leads to a low density of misfit and threading dislocations desirable in semiconductors useful in a variety of optoelectronic and microelectronic applications. Preferred buffer layers are the Group III nitrides, aluminum nitride (AlN), germanium nitride (GeN), indium nitride (InN), aluminum gallium nitride (AlGaN) and indium gallium nitride (InGaN), most preferably AlN.

Figure 13:
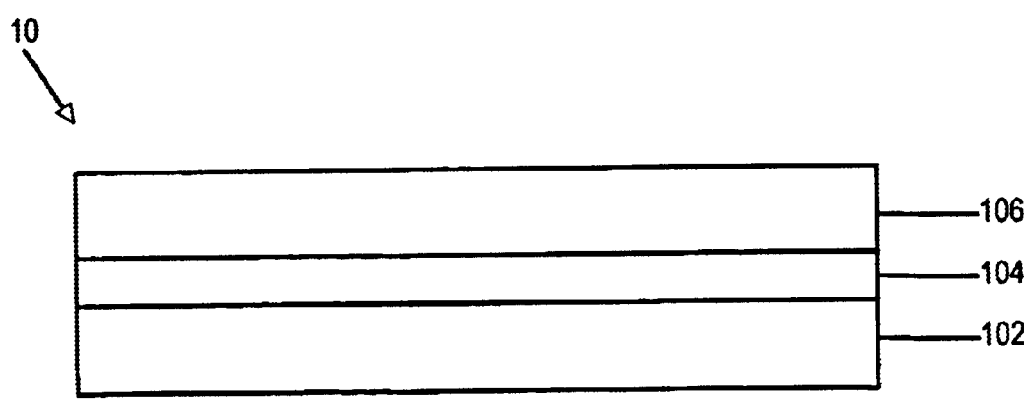
FIG. 13 is a diagram of a semiconductor structure comprising the quaternary film semiconductor and a buffer layer on a silicon substrate.

Layered semiconductor structures comprising a buffer layer and a quaternary epitaxial film having the formula YCZN deposited on the layer are provided FIG. 13 illustrates a model of a layered semiconductor structure (10) comprising semiconductor quaternary film XCYN (106), buffer layer (104) and substrate silicon or silicon carbide.

In a preferred embodiment of the method, epitaxial SiCAlN films were grown in a GSMBE chamber according to the present method from the gaseous precursor $H_3SiCN$ and Al atoms from an Knudsen effusion cell supplied to the chamber directly on 6H—SiC (0001) wafer as substrate with the substrate temperature in the region of 550° C. to 750° C.

In this instance, the α-SiC (0001) wafers were cleaned and surface scratches removed using a process described in U.S. patent application Ser. No. 09/414,953, I. S. T. Tsong et al., "Method for forming a low-defect epitaxial layer in the fabrication of semiconductor devices", herein incorporated by reference. The base pressure in the MBE chamber was about $2 \times 10^{-10}$ Torr, rising to about $5 \times 10^{-7}$ Torr during deposition. The flux rate of each species was set at about $6 \times 10^{13}$ $cm^{-2}s^{-1}$, giving a $H_3SiCN$:Al flux ratio of ~1 and a growth rate at 700–750° C. of ~4 nm $min^{-1}$. Films with thickness 130–150 nm were deposited. The deposited films had a transparent appearance as expected for a wide bandgap material.

Figure 2:
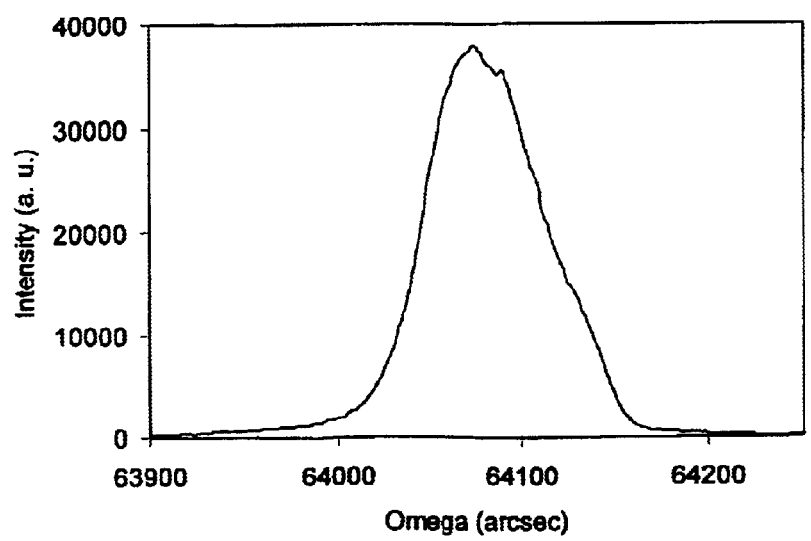
FIG. 2 is an X-ray rocking curve of an on-axis SiCAlN (0002) peak of the SiCAlN film illustrated in FIG. 1.

FIG. 1 is a high-resolution cross-sectional transmission electron microscopy (XTEM) image showing the texture and epitaxial quality of SiCAlN films grown on 6H-Si(0001) by the present method. Deposition of SiCAlN films on 6H—SiC(0001) substrates is virtually a homoepitaxial process giving a layer-by-layer growth mode which leads to a low density of misfit and threading dislocations. Excellent epitaxial behavior is observed at the interface, as shown in the by XTEM image in FIG. 1. The improved film quality is also indicated by the narrow peak width in the X-ray rocking curve with an on-axis SiCAlN (0002) peak in FIG. 2 showing a FWHM of 73.6 arcsec.

In another preferred embodiment of the present invention, SiCAlN was deposited by the present method on Si (111) crystals as the substrate. In this instance, epitaxial SiCAlN films were grown in a conventional GSMBE chamber according to the present method, as described hereinabove, directly on Si(111) wafer as substrate with the substrate temperature in the region of 550° C.–750° C.

However, in this instance, cleaning of the Si(111) substrate and removal of the native $SiO_2$ layer prior to deposition were not performed. Instead, the SiCAlN film was deposited directly on the Si(111) substrate surface with its native oxide layer intact. The EELS spectra of the SiCAlN film obtained with a nanometer beam scanned across the interface show the presence of oxygen. XTEM images of the film/substrate interface show that the amorphous oxide layer has disappeared, replaced by a crystalline interface. It appears that deposition of the SiCAlN film results in the spontaneous replacement of the amorphous $SiO_2$ layer with a crystalline aluminum oxide layer which in turn promotes epitaxial growth of SiCAlN. FIG. 4(b) is an XTEM image of SiCAlN grown in Si(111) with a native $SiO_2$ coating showing the amorphous $SiO_2$ layer replaced with a crystalline aluminum oxide layer and the epitaxial SiCAlN grown thereon.

Because of the elimination of the native $SiO_2$ layer when a crystalline SiCAlN film is grown on a Si(111) substrate, the process of depositing SiCAlN on a large-diameter Si(111) wafer will produce a large-area substrate lattice-matched for growth of Group III binary or ternary nitrides such as GaN, AlN, InN, AlGaN and InGaN. Large-diameter wafers is a term used in the art to designate wafers larger than about 2 inches.

Figure 3:
FIG. 3 is an XTEM image showing columnar growth of SiCAlN film grown on Si(111).
Figure 4A:
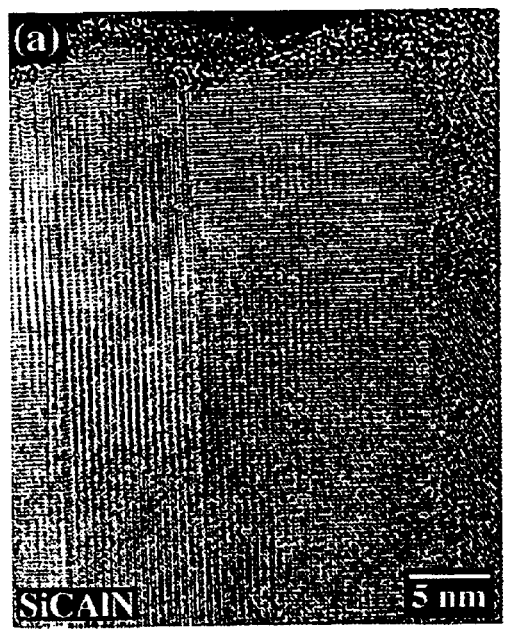
FIG. 4(a) illustrates the columnar grains.
Figure 4B:
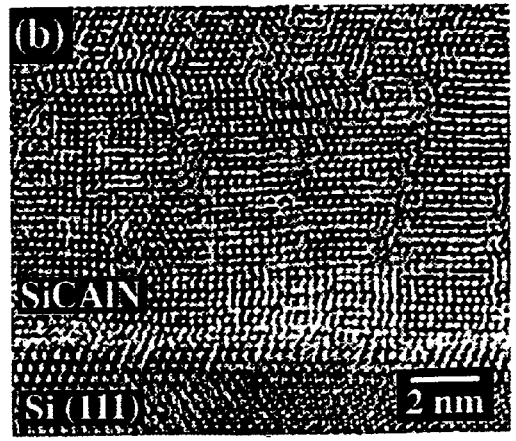
FIG. 4(b) illustrates the characteristic . . ABAB . . stacking of the 2H-wurtzite structure of the film.

The microstructure of the films is revealed by a typical XTEM image of the SiCAlN film on Si(111) shown in FIGS. 3 and 4a and 4(b). Columnar grains 25–30 nm wide extending from the film/substrate interface through the entire layer are illustrated by the XTEM image shown in FIGS. 3 and 4(a). The columns here are well-aligned with predominantly basal-plane growth. The randomness in the orientation of the crystallographic planes in the columns are visible in FIG. 3. The characteristic . . ABAB . . stacking of the 2H wurtzite structure are clearly visible in the high-resolution XTEM images of FIG. 4(b).

Characterization of the deposited films by a variety of spectroscopic and microscopic techniques yielded a near-stoichiometric composition throughout the columnar wurtzite structure with lattice parameters very close to those of 2H—SiC and hexagonal AlN. Transmission electron diffraction (TED) patterns revealed a disordered wurtzite material with lattice constants a=3.06 Å and c=4.95 Å, very close to those of 2H—SiC and hexagonal AlN. Analysis of the films with electron energy loss spectroscopy (EELS) with nanometer beam size showed the uniformity of elemental distribution throughout the SiCAlN film. The EELS results thus confirm that the film contains a solid solution of SiCAlN. All four constituent elements, Si, Al, C and N, appear together in every nanometer-scale region probed, without any indication of phase separation of SiC and AlN or any segregation of individual elements in the film. A model of the 2H hexagonal structure of SiCAlN is given in FIG. 5.

In other preferred embodiments of the invention, quaternary epitaxial films were grown on a buffer layer on the silicon substrate. In contrast to growth of SiCAlN on α-SiC (0001) substrates, there may be a large lattice mismatch between the SiCAlN film and the Si(111) substrate. In order to improve epitaxial growth of SiCAlN on Si(111), a buffer layer on Si(111) may be deposited on the Si(111) substrate prior to growth of SiCAlN. The preferred buffer layer is aluminum nitride (AlN). An AlN buffer layer may be deposited by methods known in the art, as, for example, the method disclosed in U.S. patent application Ser. No. 09/414,953, I. S. T. Tsong et al., "Method for forming a low-defect epitaxial layer in the fabrication of semiconductor devices", herein incorporated by reference. Generally, the AlN buffer layer may be deposited through a precursor containing the AlN species or in other instances Al may be provided by evaporation from an effusion cell and combined with N-atoms from a radio-frequency plasma source. Both types of deposition take place in a conventional MBE chamber.

Other preferred embodiments of the present invention provide a method for preparing epitaxial quaternary films of the formula GeCZN wherein Z is a Group III element. Epitaxial quaternary films of the formula GeCZN wherein Z is aluminum, gallium or indium or, in certain instances, transition metals, are also wide bandgap semiconductors and are an alternative optoelectronic material to SiCAlN because of the theoretical bandgap of 1.6 eV for GeC (14), Quaternary GeCAlN compounds are prepared by the present method by providing the precursor $D_3GeCN$. A flux of gaseous precursor, unimolecular $D_3GeCN$ molecules, and vapor flux of Al atoms are introduced into the GSMBE chamber maintained at a pressure whereby the precursor and Al atoms combine to form epitaxial GeCAlN thin film the substrate. Temperature during the reaction is less than 1000°

C., most preferably between about 550° C. to 750° C. Substrate is silicon, preferably Si (111) or α-SiC(0001). In certain other instances, a transition metal, Ti, or Zr, e.g. may be supplied from an effusion cell to form a series of quaternary compounds of different metal atoms.

Figure 7A:
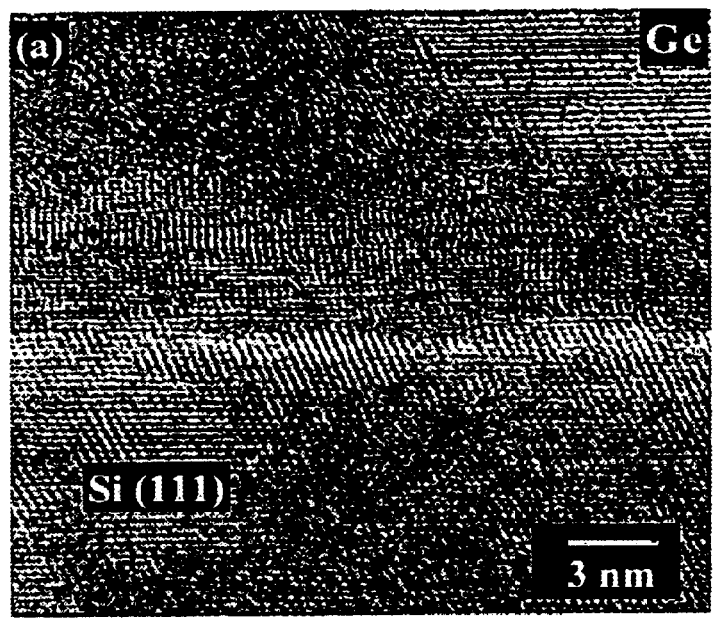
FIG. 7(a) shows a crystalline film with Ge precipitate.
Figure 7B:
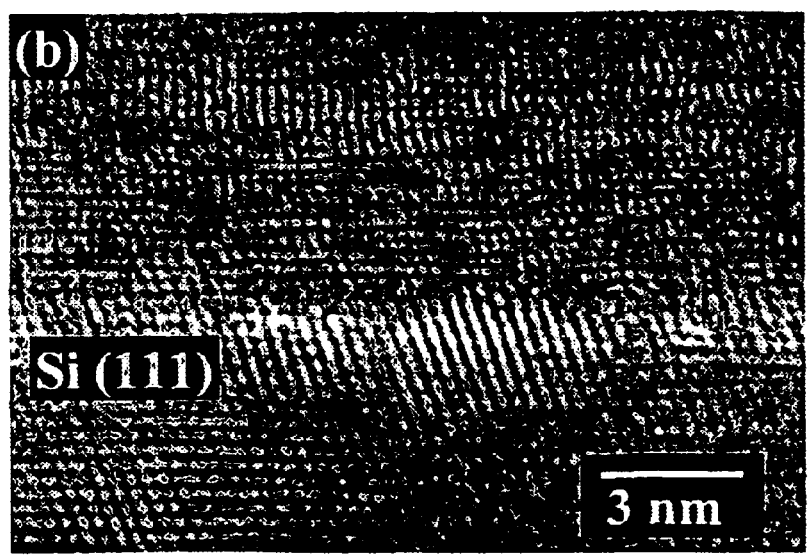
FIG. 7(b) shows the transition from cubic Si(111) to hexagonal structure of the film at the interface.

The microstructures of GeCAlN films deposited at 650° C. on Si and SiC substrates are shown in XTEM images in FIGS. 6 and 7. The diffraction data indicate that this material consists of cubic Ge particles and disordered hexagonal crystals containing all the constituent elements, Ge, Al, C and N, according to EELS analyses. RBS analyses revealed that while the Al, C and N contents are nearly equal, the Ge concentration is substantially higher than the ideal 25% value. Similar to the growth of SiCAlN on Si(111) substrates with intact native oxide layers, the XTEM images of GeCAlN/Si interfaces as depicted in FIG. 7 show a clear transition from cubic structure of the substrate to hexagonal structure of the film without the amorphous oxide layer.

Semiconductor quaternary YCZN grown in accordance with the method of the present invention may be doped in order to achieve p-type or n-type material by methods known in the art. The as-deposited SiCAlN films, e.g., are generally of n-type intrinsically. To render the film p-type, dopants known in the art, Mg, for example, may be used.

The hardness of the films prepared by the present method, defined as the applied load divided by the indented surface area, was measured using a nano-indentor (Hysitron Triboscope) attached to an atomic force microscope (AFM). Using the hardness value of 9 GPa measured for fused silica as a standard, the nano-indentation experiments yielded an average hardness of 25 GPa for the SiCAlN films, close to that measured for sapphire under the same conditions. The films deposited on silicon substrates are characterized to be true solid solutions of SiC and AlN with a 2H wurtzite structure. The hardness of these films is comparable to that of sapphire. The boron analogues, YCBN are anticipated to be especially suitable as superhard coatings because of the hardness values of the individual binary components.

The present method refers generally to epitaxial growth of nanostructures of quaternary semiconductors on substrate surfaces. Different features of the film surface can be enhanced, e.g. topography, chemical differences, or work function variations. Thus, in addition to films, quantum wells and quantum dots are provided by the present method.

Superlattice or quantum well structures comprising epitaxial YCZN films of the present invention define a class of semiconductor devices useful in a wide variety of optoelectronic and microelectronic applications. Such devices are useful in high-frequency, high-power, and high-temperature applications including applications for radiation-resistant use. Exemplary of the devices incorporating the wide bandgap semiconductors of the present invention are light-emitting diodes (LED) and laser diodes (LD). Generally, a LED comprises a substrate, α-SiC(0001), Si(111) or Si(111) with AlN buffer layer, and a multi-layer quantum well structure formed on the substrate with an active layer for light emission. In the present instance, the active layer comprises an $(YC)_{(0.5-x)}(ZN)_{(0.5+x)}$ (where 0<x<0.5) layer that is lattice-matched with the substrate and prepared by the method of the present invention.

Also exemplary of the optoelectronic devices incorporating the present semiconductors are negative electron affinity cathodes for field emission flat-panel displays, high-frequency, high-power, and high-temperature semiconductor devices, UV detectors and sensors.

A large variety of microelectronic and optoelectronic devices comprising semiconductor devices and layered semiconductor structures of the present invention are provided.

EXPERIMENTAL SECTION—Analysis and Characterization of epitaxial quaternary films grown by the method of the present invention A detailed characterization of the present quaternary YCZN films was provided by a thorough analysis utilizing a variety of techniques. The films may be more thoroughly understood in accordance with the Figures and with the results given in the following subsections entitled: (1) Composition determined by Rutherford backscattering analysis; (2) Fourier transform infrared spectroscopy (FTIR); (3) Cross-sectional transmission electron microscopy (XTEM); (4) Transmission electron diffraction (TED); (5) Energy loss spectroscopy (EELS); (6) Bandgap measurements; (7) Surface Morphology; (8) Hardness measurements.

(1) Composition of SiCAlN Films Determined by Rutherford Backscattering (RBS)

Figure 8:
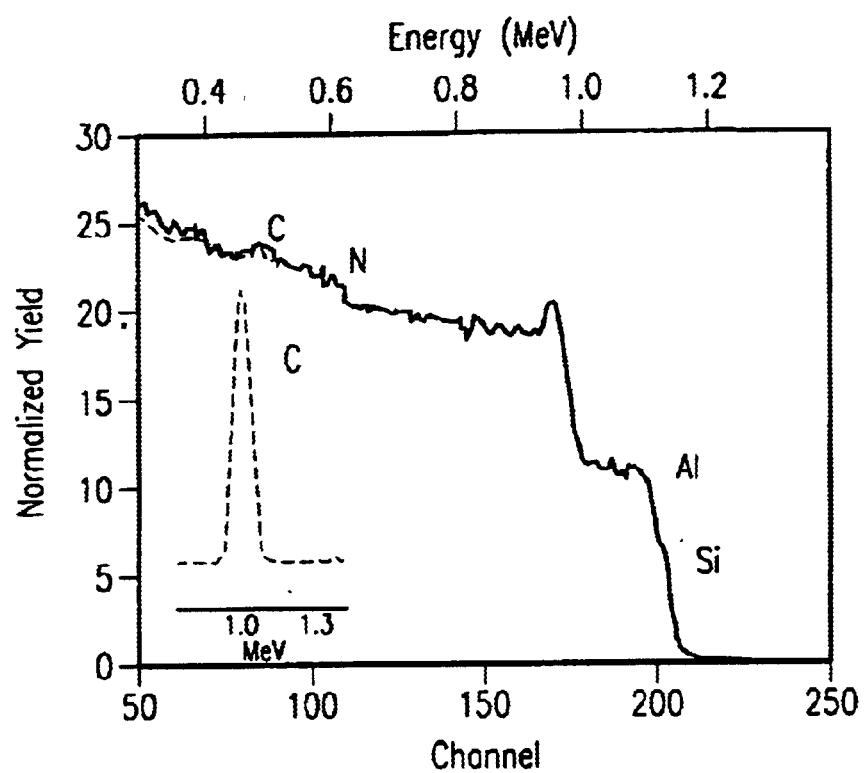
FIG. 8 is a Rutherford backscattering (RBS) spectrum of SiCAlN film grown according to the method of the present invention at 725° C. The inset shows the C resonance peak. The RBS simulations giving the atomic compositions of Si, Al, C and N are shown in dashed curves.

Rutherford backscattering spectrometry (RBS) was used to determine the elemental composition, detect H and O impurities, and estimate the film thickness. The Si and Al elemental concentrations of each film were measured at 2 MeV, and resonant nuclear reactions at 4.27 MeV and 3.72 MeV were used to determine the C and N contents respectively Results of this analysis are illustrated in FIG. 8.

The C and N concentrations in most films were nearly equal, at 23–24 at. % and 24–26 at. % respectively, suggesting that the entire C—N unit of the precursor was incorporated into the film. The Al concentration in all films was 21–23 at. %, consistent with the high affinity of Al for the N ligand, but always slightly lower than that of C and N. The Si content for all films was measured at 27–29 at. %, consistently higher than the ideal 25 at. %. Typical compositions of the SiCAlN films determined by RBS lie in the following range: Si 27–29 atomic %, Al 21–23 atomic %, C 23–24 atomic %, and N 24–26 atomic %. The Si content is consistently higher than the stoichiometric 25 atomic %. This anomaly can be attributed to a minor loss of C—N during deposition of the precursor. Alternatively, the replacement of weaker Al—C bonding (which is present in an ideally stoichiometric SiCAlN solid solution) by stronger Si—C bonding at some lattice sites may account for the excess Si over Al. Oxygen resonance at 3.05 MeV confirmed the absence of any measurable O impurities in the bulk. Forward recoil experiments showed only background traces of H, indicating the complete elimination of H ligands from the precursor during growth. Depth profiling by secondary ion mass spectrometry (SIMS) showed homogeneous elemental distribution throughout and confirmed the absence of O and other impurities.

(2) Fourier Transform Infrared Spectroscopy of SiCAlN Films (FTIR)

Figure 9:
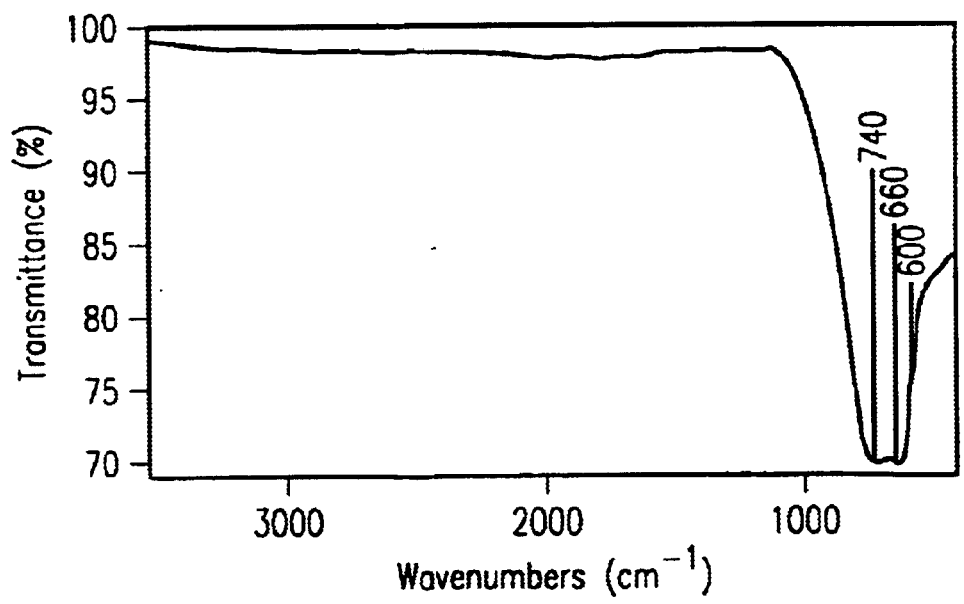
FIG. 9 is the Fourier transform infrared spectroscopy (FTIR) spectrum of a SiCAlN film made by the method of the present invention.

Fourier transform infrared spectroscopy (FTIR) in the transmission mode was used to examine the bonding properties of the constituent elements in all films. Results are illustrated in FIG. 9. The FTIR spectrum shows two broad peaks at wavenumbers 740 $cm^{-1}$ and 660 $cm^{-1}$ corresponding to Si—C and Al—N lattice vibrations respectively. These wavenumbers are significantly lower than those of pure Si—C (800 $cm^{-1}$) and pure Al—N (690 $cm^{-1}$), consistent with the formation of an extended alloy between the two binary systems. A lower intensity peak is also observed at 600 $cm^{-1}$ and is assigned to Al—C type lattice vibrations. Bands between 800–900 $cm^{-1}$ and is assigned to Al—C type lattice vibrations. Bands between 800–900 $cm^{-1}$ which would correspond to Si-N stretching absorptions are not clearly resolved in the spectrum in FIG. 9. However, their presence cannot be ruled out because it is likely that they overlap with the broad onset of the Si—C absorption. The spectrum in FIG. 9 does not show any additional peaks attributable to Si—H vibrations between 2200–2100 cm$^{-1}$, confirming the elimination of the H ligand from the precursor.

Absorption spectra taken from Fourier transform infrared spectroscopy (FTIR) show major peaks due to Si—C and Al—N lattice vibrations and minor peaks due to Al—C and Si—N vibrations, in agreement with the wurtzite structure and chemical bonding of the SiCAlN film.

(3) Cross-Sectional Transmission Electron Microscopy

The microstructure of the films was studied by cross-sectional transmission electron microscopy (XTEM). A typical high-resolution XTEM image of the epitaxial growth of SiCAlN on an α-SiC(0001) substrate is shown in FIG. 1. The characteristic . . ABAB . . stacking of the 2H wurtzite structure is clearly visible in the grains of the film shown in FIG. 1. A model atomic structure proposed for the SiCAlN epitaxial film is shown in FIG. 5. A typical XTEM image of a SiCAlN film grown on a Si(111) substrate is shown in FIGS. 3 and 4a revealing columnar grains ~25 nm wide extending from the film/substrate interface through the entire layer. The XTEM images of the SiCAlN film grown on Si(111) include some columnar grains with a-lattice planes oriented normal instead of parallel to the interface (FIG. 3).

(4) Transmission Electron Diffraction

Transmission electron diffraction (TED) patterns of SiCAlN films give lattice constants of a=3.06 Å and c=4.95 Å, very close to those of 2H—SiC and hexagonal AlN-.Transmission electron diffraction (TED) patterns indicate a disordered wurtzite material with lattice constants a=3.06 Å and c=4.95 Å, very close to those of 2H—SiC and hexagonal AlN A survey of digital diffractograms of the lattice fringes indicates that the lattice spacings are constant throughout the grains, and close to the values obtained from TED patterns.

(5) Energy Loss Spectroscopy of SiCAlN Films

Figure 10A:
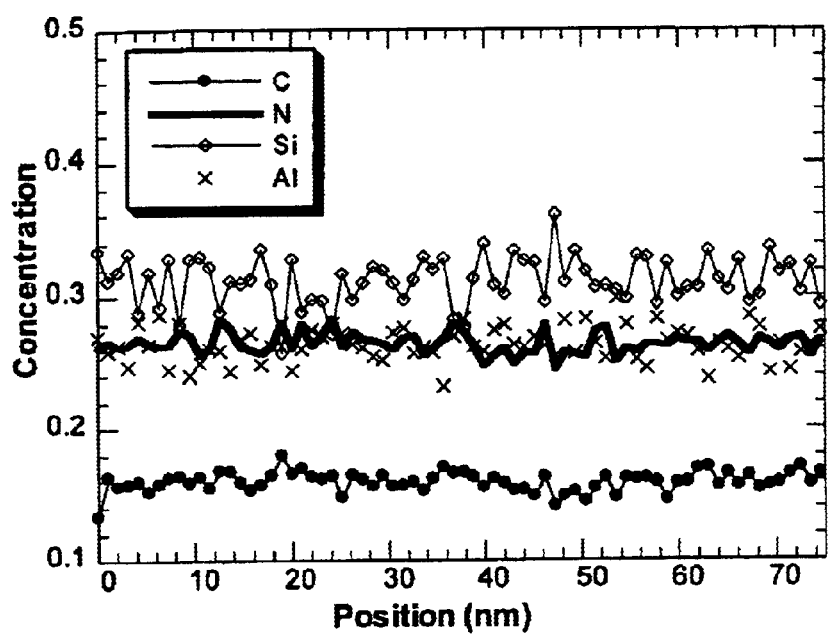
FIG. 10 is an electron energy loss spectroscopy (EELS) elemental profile scan of Si, Al, C and N sampled across 35 nm over a SiCAlN film. The region where the 35 nm scan took place on the film is shown as a white line in the lower XTEM image.
Figure 10B:

Electron energy loss spectroscopy (EELS) with nanometer beam size was used to study the uniformity of elemental distribution throughout the film. Typical elemental profiles scanned across the columnar grains in the film are shown in FIG. 10 which is an EELS elemental profile scan of Si, Al, C and N sampled across 70 nm over a SiCAlN film showing the distribution of all four constituent elements. The corresponding RBS atomic concentrations for Si, Al, N, and C are 29, 21, 26, and 24 at. % respectively. The lower C content detected by EELS is due to preferential depletion of C from the lattice sites by the electron beam. The region where the scan took place on the film is shown as a white line in the lower XTEM image All four constituent elements, Si, Al, C and N, appear together in every nanometer-scale region probed, without any indication of phase separation of SiC and Al N or any segregation of individual elements in the film.

The EELS results are accurate to within 10 at. % and thus confirm that the film contains a solid solution of SiCAlN. The minor elemental variations observed in FIG. 10 may be due to compositional inhomogeniety across grain boundaries. While the EELS elemental concentrations for N, Al, and Si in all samples are close to those obtained by RBS (certainly within the 10% error associated with the technique) the EELS elemental concentration of C is consistently lower by a significant amount than the RBS value. This is due to the preferential depletion of C from the lattice sites by the finely focused intense electron beam.

Figure 11:
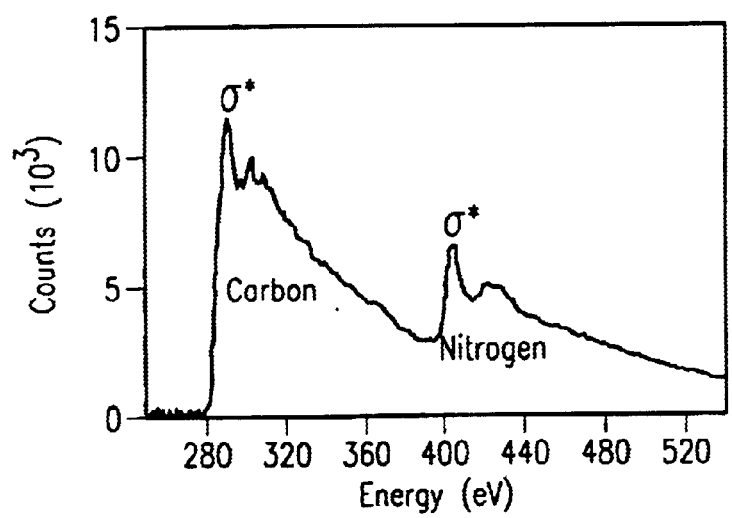
FIG. 11 illustrates an EELS spectrum showing the K-shell ionization edges of C and N characteristic of $sp^3$ hybridization of these elements in the SiCAlN film.

An EELS spectrum featuring K-shell ionization edges representing the σ* transition for both C and N is shown in FIG. 11. Peaks corresponding to π* transitions characteristic of sp$^2$ hybridization are not observed at these edges, indicating the absence of sp$^2$ hybridization are not observed at these edges, indicating the absence of sp$^2$ hybridized carbon and related planar C—N networks generally associated with the decomposition of the unimolecular precursor. The EELS spectrum thus confirms that both C and N are sp$^3$ hybridized and tetrahedrally coordinated as in SiC and AlN.

(6) Bandgap Measurements

Optical absorption experiments suggest that the bandgap for the SiCAlN epitaxial film is no less than 3.8 eV, as would be expected from the bandgaps of the constituents SiC (3.3 eV) and AlN (6.3 eV). The direct bandgap of the SiCAlN films may be observed by vacuum ultraviolet (VUV) ellipsometry.

(7) Surface Morphology

Figure 12A:
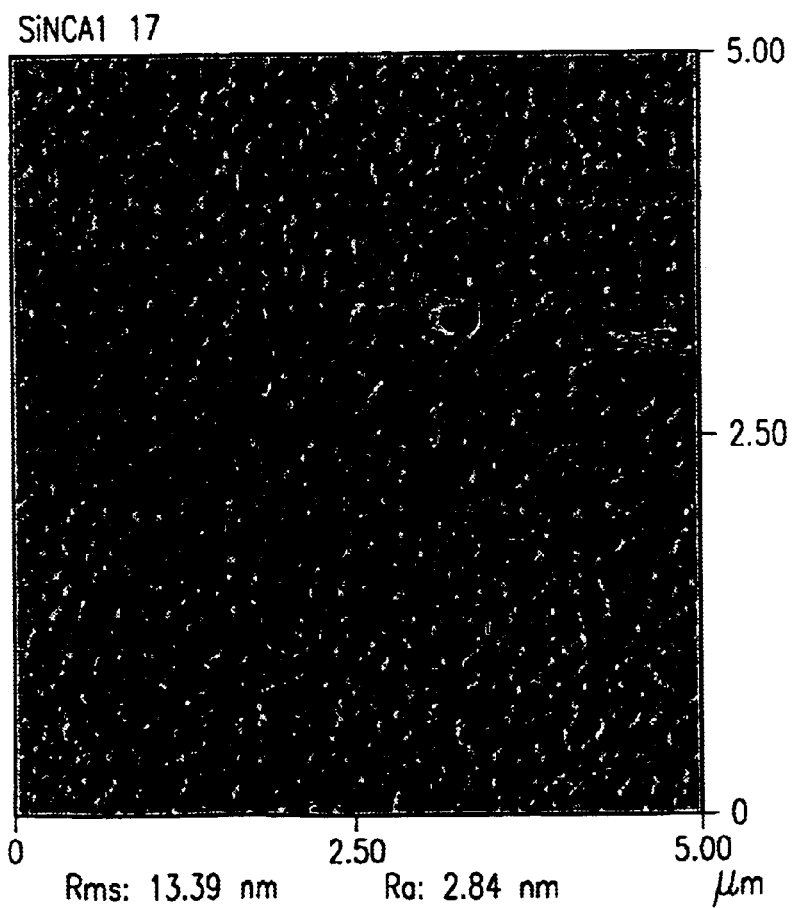
FIG. 12(a) illustrates an image at Rms: 13.39 nm Ra: 2.84 nm.
Figure 12B:
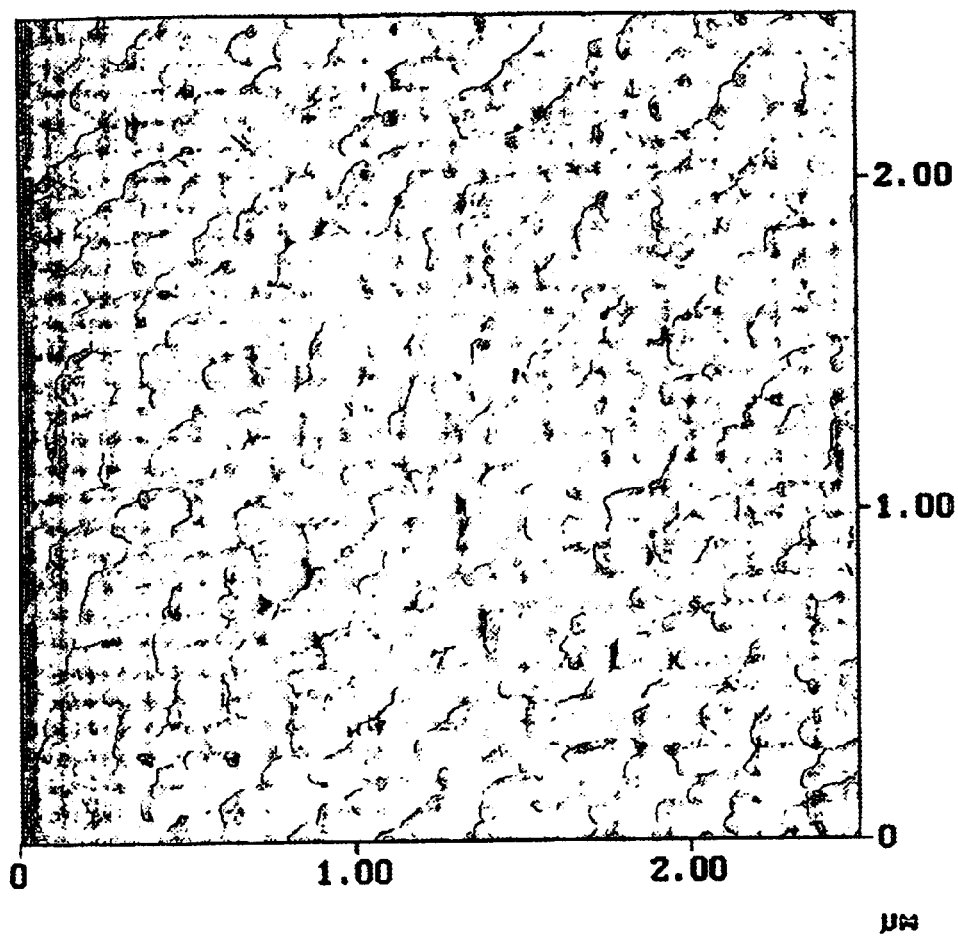
FIG. 12(b) is a higher magnification image of the same surface.

Atomic force microscope images illustrated in FIG. 12(a) and 12(b) show a relatively smooth as-grown surface of a SiCAlN thin film grown according to the method of the present invention. The complete lack of facets on the as-grown surface indicates that the predominant growth direction is basal-plane, i.e. (0001), oriented.

(8) Hardness Measurements

The SiCAlN solid solution films can also serve as superhard coatings for protection of surfaces against wear and erosion. The hardness of the films was measured using a Hysitron Triboscope attached to a Digital Instruments Nanoscope III atomic force microscope. The hardness in this case is defined as the applied load divided by the surface area of the impression when a pyramidal-shaped diamond indentor is pressed normally into the film surface. Using the hardness value of 9 GPa measured for fused silica as a standard, the indentation experiments yielded an average hardness of 25 GPa for the SiCAlN films, close to that measured for sapphire under the same experimental conditions. The reported Vickers hardness for SiC and AlN are 28±3 and 12±1 Gpa, respectively (1).

Those skilled in the art will appreciate that numerous changes and modifications may be made to the preferred embodiments of the invention and that such changes and modifications may be made without departing from the spirit of the invention. It is therefore intended that the appended claims cover all such equivalent variations as fall within the true spirit and scope of the invention.

We claim:

1. A method for depositing an epitaxial thin film having the quaternary formula YCZN wherein Y is a Group IV element and Z is a Group III element on a substrate at temperature between ambient temperature and 1000° C. in a gas source molecular beam epitaxial chamber, comprising introducing into said chamber:

i. gaseous flux of precursor H$_3$YCN wherein H is hydrogen or deuterium; and ii. vapor flux of Z atoms; under conditions whereby said precursor and said Z atoms combine to form epitaxial YCZN on said substrate.

2. The method of claim 1 wherein said temperature is about 550° C. to 750° C.

3. The method of claim 1 wherein said substrate is silicon or silicon carbide.

4. The method of claim 3 wherein said substrate is Si(111) or α-SiC(0001).

5. The method of claim 4 wherein said substrate is α-SiC(0001) comprising the additional step of cleaning said substrate prior to deposition of said quaternary film.

6. The method of claim 5 wherein said cleaning step comprises hydrogen etching.

7. The method of claim 3 wherein said substrate is a large-diameter silicon wafer.

8. The method of claim 7 wherein said silicon wafer comprises Si(111).

9. The method of claim 1 wherein said substrate is Si(111) comprising a buffer layer, and said epitaxial YCZN is deposited on said buffer layer.

10. The method of claim 9 wherein said buffer layer is a Group III nitride.

11. The method of claim 10 wherein said buffer layer is AlN.

12. The method of claim 1 wherein Y is silicon, germanium or tin.

13. The method of claim 1 wherein Z is aluminum, gallium or indium.

14. The method of claim 1 wherein Z is boron.

15. The method of claim 1 for depositing thin film YCZN wherein Y is silicon and said precursor is $H_3SiCN$.

16. The method of claim 1 for depositing the thin film YCZN wherein Y is germanium and said precursor is $H_3GeCN$.

17. The method of claim 1 for depositing epitaxial thin film SiCZN on a substrate wherein said precursor is $H_3SiCN$, said Z atom is aluminum and said substrate is Si(111) or α-SiC(0001).

18. The method of claim 1 for depositing epitaxial thin film GeCZN on a substrate wherein said precursor is $D_3GeCN$, said Z atom is aluminum and said substrate is Si(111) or α-SiC(0001).

19. The method of claim 1 for depositing epitaxial thin film having the formula $(YC)_{(0.5-x)}(ZN)_{(0.5+x)}$ wherein x is chosen to be a value $0 < x \leq 0.5$, and Z is the same or different in each occurrence, comprising in addition the step of introducing into said chamber a flux of nitrogen atoms and maintaining the flux of said precursor, said nitrogen atoms and said Z atoms at a ratio selected to produce quaternary semiconductors having said chosen value of x.

* * * * *